United States Patent [19]

Ahmed

[11] 4,213,068
[45] Jul. 15, 1980

[54] TRANSISTOR SATURATION CONTROL
[75] Inventor: Adel A. A. Ahmed, Annandale, N.J.
[73] Assignee: RCA Corporation, New York, N.Y.
[21] Appl. No.: 873,610
[22] Filed: Jan. 30, 1978
[51] Int. Cl.$^2$ .................. H03K 3/26; H03K 17/60; H03K 23/22
[52] U.S. Cl. .................. 307/255; 307/296 R; 307/300; 307/310; 307/315
[58] Field of Search .............. 307/300, 310, 255, 252, 307/291, 296, 297, 315

[56] References Cited
U.S. PATENT DOCUMENTS

| | | | |
|---|---|---|---|
| 3,435,257 | 3/1969 | Lawrie, Jr. | 307/291 |
| 3,534,281 | 10/1970 | Hillhouse | 307/300 |
| 3,999,086 | 12/1976 | Ekelund | 307/300 |
| 4,107,472 | 8/1978 | Kawanami et al. | 307/252 B |

FOREIGN PATENT DOCUMENTS 1358287 7/1974 United Kingdom.
1490631 11/1975 United Kingdom.

OTHER PUBLICATIONS

IBM Tech. Disclre. Bulletin, Nonsaturating Inverting Amplifier, J. B. Atkins, vol. 7, No. 7, 12/64, pp. 596 & 597.
IBM Tech. Disclre. Bulletin, Monolithic Storage Mode Switch, J. Sala, vol. 12, No. 7, 5/70, pp. 2076 & 2077.

Primary Examiner—Stanley D. Miller, Jr.
Assistant Examiner—B. P. Davis
Attorney, Agent, or Firm—Eugene M. Whitacre; William H. Meagher; Scott J. Stevens

[57] ABSTRACT

A circuit for improving the characteristics of a transistor connected in the common emitter amplifier configuration with a load includes an impedance connected across the base-emitter junction. A source of bias coupled to the impedance establishes the conductivity of the transistor. A second transistor of opposite conductivity type to the first and connected as a follower between the collector and base of the first transistor becomes active when the first transistor becomes highly conductive. The emitter follower closes a degenerative feedback loop, reducing the effect of the source of bias in causing increased conductivity of the first transistor.

6 Claims, 9 Drawing Figures

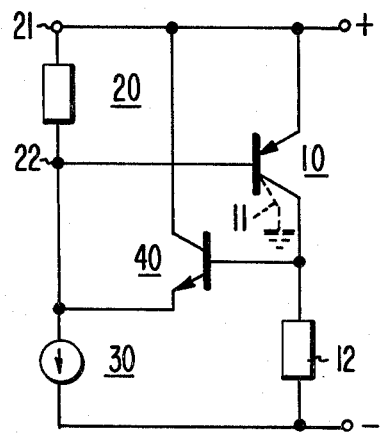
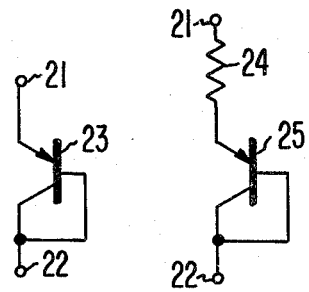
Fig.1a    Fig.1b    Fig.1c    Fig.1d
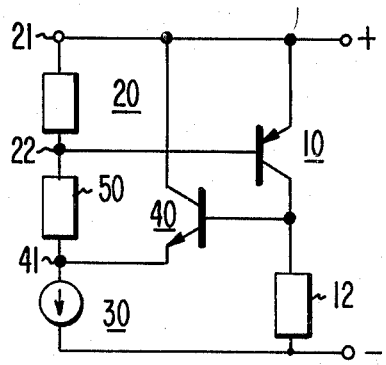
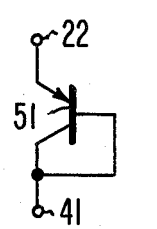
Fig.2a    Fig.2b    Fig.2c    Fig.2d
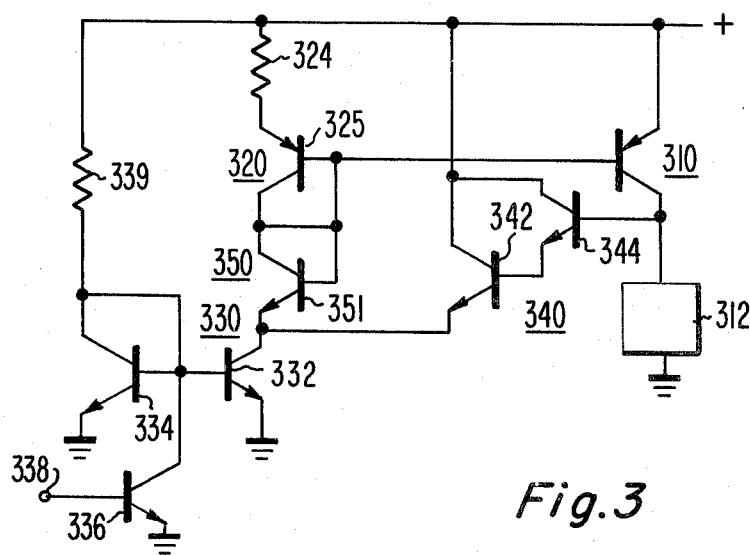
Fig.3

TRANSISTOR SATURATION CONTROL

This invention relates to transistors operated in a saturated mode.

Bipolar transistors are often used as electronic switching devices by which a load may be controllably coupled to a source of energy. In order to reduce power consumption in the form of transistor dissipation, the closed or conductive switch is operated in the well-known saturated mode. Operation in saturation, however, gives rise to certain difficulties.

Switching transistors which must be operated at high speed and high power, such as the discrete horizontal output transistor of a television receiver deflection circuit, are desirably operated near saturation in order to reduce power dissipation during the conducting interval. However, operation in extreme saturation affects the base region of the transistor in such a way that current continues to flow in the transistor after the time at which the base signal is of a polarity to render the transistor nonconductive. This causes an undesirable time delay in turn-off, and tends to increase the power dissipated in the transistor. Arrangements using diodes coupled from collector to base to prevent saturation are known from U.S. Pat. No. 3,688,153 issued Aug. 29, 1972 in the name of Carl Wheatley, Jr. and U.S. Published Patent Application No. B530,285 issued Apr. 6, 1976 in the name of Sakamoto, et al.

In integrated circuit applications wherein a bipolar transverse transistor (generally of PNP conductivity type) drives a load and is operated in saturation, large leakage currents to the substrate of the integrated circuit can occur. These leakage currents increase disproportionately with increasing degrees of saturation of the transverse transistor, and are believed to be due to the action of a parasitic transistor having a base-emitter junction in parallel with the base-emitter junction of the intended transistor, and having as a collector the substrate of the integrated circuit. It is desirable to control the amount or degree of saturation during those intervals in which the transistor is intended to act as a closed switch for reduced parasitic leakage currents, improved switching time, or both.

SUMMARY OF THE INVENTION

A circuit arrangement for improving the characteristics of a transistor operated in saturation includes a first transistor having first and second electrodes defining a first controllable current conducting path and also having a control electrode. The controllable current conducting path couples a source of energizing potential with a utilization load. A conduction control arrangement coupled to the control electrode of the first transistor produces a current in the control electrode for establishing the conductivity of the controlled current conducting path. A second transistor including first and second electrodes defining a second controllable current path has the second controllable current path coupled across the first and control electrodes of the first transistor, and the second transistor control electrode is coupled to the second electrode of the first transistor to form a degenerative feedback loop which reduces the effect of the conduction control arrangement when the first transistor is highly conductive or saturated.

DESCRIPTION OF THE DRAWING

FIGS. 1, 2 and 3 are diagrams partially in block and partially in schematic form illustrating various embodiments of the invention.

DESCRIPTION OF THE INVENTION

In FIG. 1a, a PNP transistor designated generally as 10 has its emitter connected to a positive terminal 21 of a source of potential and a collector connected to a load 12, the other end of which is connected to the negative terminal of the source of potential. When transistor 10 is formed as a lateral transistor in an integrated circuit, through well-known techniques, it will have associated with it a parasitic transistor having base and emitter electrodes which appear to be in parallel with or common with the base and emitter electrodes intended to be formed during manufacture of the integrated circuit. The parasitic transistor has as its collector 11 the substrate of the integrated circuit. The parasitic transistor, while always present, becomes objectionable when its currents become significant compared with the currents of the intended transistor.

The base of transistor 10 is coupled to a terminal 22 which is coupled to one end of a controlled bias current source designated generally as 30, the other end of which is coupled to the negative terminal of the source of potential. Bias source 30 may be of a conventional type, and supplies base current to the base of transistor 10 to establish the conductivity of the collector-emitter conduction path of transistor 10. Source 30 may be gated in known fashion.

The base-emitter junction of transistor 10 is paralleled by an impedance designated generally as 20 coupled between terminals 21 and 22. FIG. 1b illustrates a diode 23, formed of a transistor having joined collector and base electrode, which may be used as impedance 20 to provide temperature-independent biasing of the collector current of transistor 10 in proportion to the current of bias source 30. FIG. 1c illustrates a series arrangement of a resistance 24 and a diode 25 which may be coupled between terminals 21 and 22 in place of impedance 20 for causing the collector current of transistor 10 to exceed that established by a diode alone as in the configuration of FIG. 1b, or for compensating for emitter resistance of transistor 10. As shown in FIG. 1d, a resistance 26 may be used between terminals 21 and 22, as may be required. Resistance 26 may be infinitely high, in which case transistor 10 produces maximum collector current for a given current in bias source 30. A practical implementation of such an infinite resistance simply eliminates impedance 20 from the circuit.

When it is desired to operate transistor 10 in a saturated mode as for switching, it is often desirable to reduce the switching-off time caused by excessive carriers in the base region, or to reduce the aforementioned leakage current occurring when transistor 10 is part of an integrated circuit, by controlling the degree of saturation of the transistor. For this purpose, a transistor designated generally as 40 has its base coupled to the collector of transistor 10 in discrete circuits, or to the intended collector of lateral transistor 10 in integrated circuits. The collector of transistor 40 is coupled to the positive terminal of the source of potential, and the emitter is coupled to the base of transistor 10.

In operation during those times in which transistor 10 is either nonconductive or operating in its linear mode, which is to say, when the collector-base junction of transistor 10 is reversed biased, the base-emitter junction of transistor 40 is also reverse biased, and both the base-emitter and collector-emitter conduction paths of transistor 40 are nonconductive. As the current produced by bias current source 30 is increased, transistor 10 will progressively become more saturated, and its collector potential will more and more closely approach the potential of its emitter. This provides progressively more forward bias to the collector-base junction of transistor 10 and also to the base-emitter junction of transistor 40. With increasing saturation of transistor 10, the base-emitter junction of transistor 40 becomes forward biased and conducts, bypassing current from bias current source 30 away from the base electrode of transistor 10 to its collector. This reduces the influence on the conduction of transistor 10 of bias current produced by source 30 when transistor 10 is already highly conductive.

Also, when the base-emitter junction of transistor 40 conducts, its collector-emitter conduction path also conducts, with a current established by the current gain of transistor 40. This bypasses even more current from bias source 30 away from the base electrode of transistor 10, further reducing the influence of bias source 30 on the conduction of transistor 10. In effect, at high levels of collector-emitter conductivity of transistor 10, a degenerative feedback loop including emitter follower 40 is coupled around transistor 10 in such a manner as to oppose further increases in conductivity.

It is known that under high conductivity conditions, the collector potential does not ordinarily reach the potential of the emitter of the saturated transistor. Thus, even when transistor 10 is highly conductive, the forward bias across the collector-base junction is somewhat less than the forward bias on the base-emitter junction. Since the forward bias potential applied to the base-emitter junction of transistor 40 is substantially the same as the collector-base voltage of transistor 10, the base-emitter junction of transistor 40 will ordinarily receive less forward bias than transistor 10, and less base-emitter current can be expected to flow, due to the exponential nature of the voltage-current characteristic of the junction. This small current flow in the base-emitter junction may not in itself be sufficient to control the saturation of transistor 10.

Since transistor 40 has current gain, however, the effect of reduced forward bias of transistor 40 on the degenerative feedback loop during saturation of transistor 10 is mitigated. Thus, the gain of transistor 40 increases the gain of the degenerative feedback loop coupled around transistor 10, making the loop effective at lower forward bias levels of the collector-base junction of transistor 10 (i.e., at a lower degree of saturation) than would be the case with a simple diode.

The gain of the degenerative feedback loop tending to stabilize the degree of saturation of transistor 10 includes the gain of transistor 10, operating in the common mode. In those cases in which the gain of transistor 10 decreases with increasing degrees of saturation, the gain of the degenerative feedback loop decreases with increasing saturation, resulting in a progressive loss of saturation control with increasing saturation. The additional gain resulting from the use of amplification in that portion of the feedback loop coupled around (from collector to base of) transistor 10 reduces the dependence of the saturation control on the gain characteristics of the controlled transistor compared with the use of diode feedback.

By selecting a transistor 40 having a large geometry and resulting relatively low base-emitter junction offset voltage, the degenerative feedback loop can be made to close and become effective at a lower degree of saturation of transistor 10 than would be the case with a small geometry transistor.

By means of a semiconductor junction coupled as described between the collector and the base of transistor 10, the degree of saturation of an intended lateral transistor can be controlled, thereby reducing leakage currents due to the associated parasitic transistor. When, as also described, the feedback path including the semiconductor junction further includes gain, the degree of saturation can be more closely controlled so as to minimize the effect of the parasitic transistor on the intended transistor.

In FIG. 2a, another embodiment of the invention is illustrated. Elements of the circuit corresponding to those of FIG. 1a are designated by the same reference numerals. In FIG. 2a, the emitter of transistor 40 is coupled to bias current source 30 at a terminal 41. An impedance 50 if coupled between terminals 22 and 41. Impedance 50 is coupled in series with bias source 30, and is also coupled in series with the parallel combination of the base-emitter junction of transistor 10 and impedance 20. As in the case of FIG. 1, the impedance of 20 may be infinite.

The arrangement of FIG. 2a makes operation of the degenerative feedback circuit more positive. Impedance 50 may include a diode 51 as shown in FIG. 2b, a resistor 54 as shown in FIG. 2d or a combination of both as shown by resistor 52 and diode 53 of FIG. 2c. For silicon integrated circuit applications where a resistor 54 is used, the value of the resistor can be chosen to create a voltage drop on the order of 50 to 100 millivolts, which then constitutes an adequate differential by which the operation of transistor 40 is assured when transistor 10 is saturated but well outside the region of massive saturation at which the unwanted degradations occur.

FIG. 3 illustrates an embodiment of the invention in which Darlington or compound-connected transistors are used. In FIG. 3, elements corresponding to those of FIGS. 1 and 2 are designated by the same numeral with a 3 prefix. Gated current source 30 of FIGS. 1 and 2 is embodied as gated current source 330 in FIG. 3, and includes a current mirror amplifier consisting of diode-connected transistor 334 coupled across the base-emitter junction of transistor 332. A resistor 339 is coupled at one end to the positive source of potential and at the other end to the ungrounded end of transistor 334. The current flow in transistor 332 is established by the geometry of the transistors and by the current flow in resistor 339. The collector current of transistor 332 can be gated under the control of a transistor 336 having its collector-emitter path coupled across diode 334 and having its base coupled to a control terminal 338. Control of the collector of transistor 332 controls the conductivity of transistor 310.

The collector of transistor 332 is coupled by way of a second impedance means 350 including a diode-connected transistor 351 to the base of transistor 310. A first impedance means designated generally as 320 and including the series combination of a resistor 324 and a diode-connected transistor 325 is coupled across the base-emitter junction of transistor 310.

Saturation control of transistor 310 is provided by Darlington-connected transistors 324 and 344 forming a transistor means 340. Due to the Darlington connection of transistors 342 and 344, only the base current of transistor 342 flows in the emitter of transistor 344, and the base-emitter current of transistor 344 is therefore ordinarily much less than the base-emitter current of transistor 342. The base-emitter junction offset potential of transistor 344 is therefore less than that of transistor 342. Since the base-emitter junction potential of transistor means 340 is the sum of the junction potentials of transistors 342 and 344, the junction potential of transistor means 340 is less than the sum of two semiconductor junctions with currents equal to those of transistor 342. The base-emitter junction potential of transistor means 340 is thereby made to be less than the sum of the junction offset potentials of diodes 351 and the base-emitter junction of transistor 310. This compensates for the reduced forward bias available for transistor means 340 due to saturation of transistor 310, and makes the feedback loop more responsive at low amounts of saturation of transistor 10. While in the following claims, the terms "base", "emitter", and "collector", are used, the person skilled in the art will readily understand that source, gate, and drain electrodes of a field-effect transistor correspond and that field-effect and other transistors may be used to practice the invention in an equivalent fashion.

What is claimed is:

1. A circuit arrangement for improving the characteristics of a transistor operated in saturation, comprising:
   first transistor means including first and second electrodes defining a first controllable current conducting path and also including a control electrode, said controllable current conducting path coupling a source of energizing potential with a load;
   conduction control means coupled to said control electrode of said first transistor means for establishing a control current therein for establishing the desired conductivity of said controlled current conducting path;
   second transistor means including first and second electrodes defining a second controllable current path and also including a control electrode, said second controllable current path being coupled to said first and control electrodes of said first transistor means for controlling said control current in said first transistor means;
   means coupling said control electrode of said second transistor means to said second electrode of said first transistor means thereby forming a degenerative feedback loop which reduces the effect of said conduction control means when said first transistor means is saturated; wherein:
   said first, second and control electrodes of said first and second transistor means comprise emitter, collector and base electrodes, respectively;
   said emitter electrode of said first transistor means is coupled to a first terminal of said source of energizing potential and said collector electrode is coupled to said load, said first transistor means being of PNP conductivity type; and
   said second transistor means comprises first and second compound-connected transistors of NPN conductivity type having effective emitter, collector and base electrodes corresponding to said first, second and control electrodes, respectively of said second transistor means.

2. A circuit according to claim 1 wherein said conduction control means includes first impedance means coupled in parallel with the collector-emitter controlled conduction path of said second transistor means.

3. A circuit according to claim 2 wherein said first impedance means comprises first and second serially coupled semiconductor junction means.

4. A circuit according to claim 3 wherein said first impedance means further comprises resistance means serially coupled with said first and second semiconductor junction means.

5. A circuit according to claim 4 wherein said conduction control means further comprises third impedance means coupled to said first impedance means and to a second terminal of said source of energizing potential, the current through said third impedance means being variable for establishing the desired conductivity.

6. A circuit according to claim 5 wherein said third impedance means comprises third transistor means having a collector coupled to said first impedance means.

* * * * *